United States Patent
Thomson et al.

(10) Patent No.: US 6,961,718 B2
(45) Date of Patent: Nov. 1, 2005

(54) VECTOR ESTIMATION SYSTEM, METHOD AND ASSOCIATED ENCODER

(75) Inventors: Mark Thomson, Carlton (AU); Simon Boland, Pennant Hills (AU); Michael Smithers, San Francisco, CA (US); Zhenjie Wu, Hurstville (AU)

(73) Assignee: Motorola, Inc., Schaumburg, IL (US)

( * ) Notice: Subject to any disclaimer, the term of this patent is extended or adjusted under 35 U.S.C. 154(b) by 793 days.

(21) Appl. No.: 09/993,207

(22) Filed: Nov. 16, 2001

(65) Prior Publication Data

US 2003/0171830 A1 Sep. 11, 2003

(51) Int. Cl.[7] .................................................. G06N 5/00
(52) U.S. Cl. ......................................... 706/13; 706/45
(58) Field of Search ........................... 342/383; 381/66; 706/13, 14; 708/100

(56) References Cited

U.S. PATENT DOCUMENTS

| | | | | |
|---|---|---|---|---|
| 5,694,474 A | * | 12/1997 | Ngo et al. | 381/166 |
| 5,761,383 A | * | 6/1998 | Engel et al. | 706/14 |
| 6,107,963 A | * | 8/2000 | Ohmi et al. | 342/383 |
| 6,272,479 B1 | * | 8/2001 | Farry et al. | 706/13 |

\* cited by examiner

Primary Examiner—Wilbert L. Starks, Jr.

(57) ABSTRACT

An encoder and associated vector estimation method and system (1) for processing a sequence of input vectors ($y_0$ to $y_T$) each comprising a plurality of elements. The vector estimation system (1) has a digital filter (2) with a filter vector input (3) for receiving said sequence of input vectors ($y_0$ to $y_T$) and a predictor gain input (4) for controlling characteristics of the filter (2). The filter (2) is a Kalman filter and has both a current slowly evolving filter estimate output (6) and a previous slowly evolving filter estimate output (20). The current slowly evolving filter estimate output (6) provides a current filtered estimate value of a slowly evolving component of said sequence of input vectors ($y_0$ to $y_T$) and the previous slowly evolving filter estimate output (20) provides a previous filtered estimate value of the slowly evolving component of said sequence of input vectors ($y_0$ to $y_T$). There is also a parameter estimator (10) having an estimator vector input (19) for receiving said sequence of input vectors ($y_0$ to $y_T$) and a previous slowly evolving filter estimate input (13) coupled to the previous slowly evolving filter estimate output (20). The parameter estimator further includes a predictor gain output coupled (11) to the predictor gain input (4). In operation, when the vector estimation system (1) receives a current input vector that is one of the sequence of said input vectors ($y_0$ to $y_T$), the parameter estimator (10) provides a current predictor gain value at the predictor gain output (11) thereby modifying the current filtered estimate value. The current predictor gain value is dependent upon both the previous filtered estimate value and the current input vector.

21 Claims, 5 Drawing Sheets

VECTOR ESTIMATION SYSTEM, METHOD AND ASSOCIATED ENCODER

FIELD OF THE INVENTION

This invention relates to an encoder and a vector estimation system and method for processing a sequence of vectors to determine a filtered estimate value of each vector. The invention is particularly useful for, but not necessarily limited to, determining filtered estimate values to be encoded by a speech encoder and transmitted over a communication link.

BACKGROUND ART

A digital speech communication or storage system typically uses a speech encoder to produce a parsimonious representation of the speech signal. A corresponding decoder is used to generate an approximation to the speech signal from that representation. The combination of the encoder and decoder is known in the art as a speech codec. As will be apparent to a person skilled in the art, many segments of speech signals contain quasiperiodic waveforms. Accordingly, consecutive cycles of quasiperiodic waveforms can be considered, and processed, by a speech codec as data vectors that evolve slowly over time.

An important element of a speech codec is the way it exploits correlation between consecutive cycles of quasiperiodic waveforms. Frequently, correlation is exploited by transmitting a single cycle of the waveform, or of a filtered version of the waveform, only once every 20–30 ms, so that a portion of the data is missing in the received signal. In a typical decoder the missing data is determined by interpolating between samples of the transmitted cycles.

In general, the use of interpolation by a speech decoder to generate data between the transmitted cycles only produces an adequate approximation to the speech signal if the speech signal really is quasiperiodic, or, equivalently, if the vectors representing consecutive cycles of the waveform evolve sufficiently slowly. However, many segments of speech contain noisy signal components, and this results in comparatively rapid evolution of the waveform cycles. In order for waveform interpolation in an encoder to be useful for such signals, it is necessary to extract a sufficiently quasiperiodic component from the noisy signal in the encoder. This extracted component may be encoded by transmitting only selected cycles and decoded by interpolation in the manner described above. The remaining noisy component may also be encoded using other appropriate techniques and combined with the quasiperiodic component in the decoder.

Linear low pass filtering a sequence of vectors representing consecutive cycles of speech in the time dimension is well known in the speech coding literature. The difficulty with this approach is that in order to get good separation of the slowly and rapidly evolving components, the low pass filter frequency response must have a sharp roll-off. This requires a long impulse response, which necessitates an undesirably large filter delay.

A Kalman filter technique for estimating quasiperiodic signal components has been described by Gruber and Todtli (IEEE Trans Signal Processing, Vol. 42, No. 3, March 1994, pp 552–562). However, because this Kalman filter technique is based on a linear dynamic system model of a frequency domain representation of the signal, it is unnecessarily complex. It also assumes that the dynamic system model parameters (i.e. noise energy and the harmonic signal gain) are known. However, when considering speech coding, noise energy and the harmonic signal gain parameters are not known.

A technique for determining the system parameters required in a Kalman filter using an Expectation Maximisation algorithm has been described in a more general setting by Digalakis et al (IEEE Trans Speech and Audio Processing, Vol. 1, No. 4, October 1993, pp 431–442). However, the technique is iterative, and in the absence of good initial estimates may converge slowly. It may also produce a result that is not globally optimal. No prior art method is known for obtaining good initial estimates. Further, this method typically requires a significant amount of data, over which the unknown parameters are constant. In the context of speech coding, where the parameters change continuously, rapid estimation is essential, and therefore this method of applying the Expectation Maximization algorithm needs to be improved.

Stachurski (PhD Thesis, McGill University, Montreal Canada, 1997) proposed a technique for estimating quasiperiodic signal components of a speech signal. This method involves minimizing a weighted combination of estimated noise energy and a measure of rate of change in the quasiperiodic component. This method is highly complex and does not allow the rate of evolution of the quasiperiodic component to be specified independently. Nor does it allow for an independently varying gain for the quasiperiodic component.

In this specification, including the claims, the terms comprises, comprising or similar terms are intended to mean a non-exclusive inclusion, such that a method or apparatus that comprises a list of elements does not include those elements solely, but may well include other elements not listed.

SUMMARY OF THE INVENTION

According to one aspect of the invention there is provided a vector estimation system for processing a sequence of input vectors, said input vectors each comprising a plurality of elements, and said system comprising:

a digital filter with a filter vector input for receiving said sequence of input vectors and a predictor gain input for controlling characteristics of said filter, said digital filter also having both a current slowly evolving filter estimate output and a previous slowly evolving filter estimate output, said current slowly evolving filter estimate output providing a current filtered estimate value of a slowly evolving component of said sequence of input vectors and said previous slowly evolving filter estimate output providing a previous filtered estimate value of said slowly evolving component of said sequence of input vectors; and a parameter estimator having an estimator vector input for receiving said sequence of input vectors and a previous slowly evolving filter estimate input coupled to said previous slowly evolving filter estimate output, said parameter estimator further includes a predictor gain output coupled to said predictor gain input, wherein when said vector estimation system receives a current input vector that is one of said sequence of said input vectors, said parameter estimator provides a current predictor gain value at said predictor gain output thereby modifying said current filtered estimate value at said current slowly evolving filter estimate output, said current predictor gain value being dependent upon both said previous filtered estimate value received at said slowly evolving filter estimate input and said current input vector received at said estimator vector input.

Suitably, said parameter estimator is characterised by said current predictor gain value being dependent upon both a sequence of previous said input vectors and a sequence of filtered estimate values provided by successive preceding values of said previous filtered estimate value.

Preferably, said current predictor gain value is determined by said parameter estimator calculating the following:

$$(y_n^T \cdot x_{f,n-1})/(x_{f,n-1}^T \cdot x_{f,n-1})$$

wherein, $y_n^T$ is the transpose of said current input vector $y_n$ that is an nth one of said sequence of input vectors; and $x_{f,n-1}^T$ is the transpose of the previous filtered estimate value $x_{f,n-1}$ resulting from a previous input vector $y_{n-1}$.

Preferably, said filter has a predictor error variance output and an observation noise variance input, said predictor error variance output providing a current predictor error variance value.

Suitably, said parameter estimator has an observation noise variance output coupled to said observation noise variance input, and a predictor error variance input coupled to said predictor error variance output, said predictor error variance output providing a current predictor error variance value, wherein when said vector estimation system receives said current input vector, said parameter estimator provides a current observation noise variance value at said observation noise variance output thereby modifying said current filtered estimate value at said current slowly evolving filter estimate output, said current observation noise variance value being dependent upon said previous filtered estimate value received at said previous slowly evolving filter estimate input, said current input vector received at said estimator vector input, said current predictor gain value and said current predictor error variance value.

Suitably, said current observation noise variance value is determined by calculating the following:

$$(y_n^T \cdot (y_n - \alpha_n \cdot x_{f,n-1})/N) - \Sigma p, n$$

wherein N is a number of elements of said current input vector $y_n$; $\Sigma_{p,n}$ is the current predictor error variance value associated with said current input vector $y_n$; $\alpha_n$ is said current predictor gain value; and $x_{f,n-1}$ is said previous filtered estimate value.

Preferably, said parameter estimator has an OnsetFlag output coupled to an OnsetFlag input of said digital filter, wherein if a signal at said OnsetFlag input is above a threshold value dependent upon harmonic energy in said current input vector, said previous filtered estimate value is set to a filtered estimate value $x_{f,n-1}$.

Suitably, if said signal at said OnsetFlag input is below the threshold value dependent upon harmonic energy in said current input vector, said previous filtered estimate value is set to a previous input vector $y_{n-1}$.

Preferably, the parameter estimator has an unvoiced speech module that determines the current input vector's harmonic energy content by assessing the current predictor gain value and depending upon the current predictor gain value the parameter estimator selectively sets the current predictor gain value and the current observation noise variance value.

According to another aspect of the invention there is provided a vector estimation system for processing a sequence of input vectors, said input vectors each comprising a plurality of elements, and said system comprising:

a digital filter with a filter vector input for receiving said sequence of input vectors and an observation noise variance input for controlling characteristics of said filter, said digital filter also having a current slowly evolving filter estimate output, a predictor error variance output and a previous slowly evolving filter estimate output, said current slowly evolving filter estimate output providing a current filtered estimate value of a slowly evolving component of said sequence of input vectors, said predictor error variance output providing a current predictor error variance value and said previous slowly evolving filter estimate output providing a previous filtered estimate value of said slowly evolving component of said sequence of input vectors; and a parameter estimator having an estimator vector input for receiving said sequence of input vectors and a previous slowly evolving filter estimate input coupled to said previous slowly evolving filter estimate output, said parameter estimator further includes a observation noise variance output coupled to said observation noise variance input, wherein when said vector estimation system receives a current input vector that is one of said sequence of said input vectors, said parameter estimator provides a current observation noise variance value at said observation noise variance output thereby modifying said current filtered estimate value at said current slowly evolving filter estimate output, said current observation noise variance value being dependent upon said current input vector, said current predictor error variance value, and said previous filtered estimate value.

Suitably, said current observation noise variance value is determined by calculating the following:

$$(y_n^T \cdot (y_n - x_{f,n-1})/N) - \Sigma p, n$$

wherein $y_n^T$ is the transpose of said current input vector $y_n$ that is an nth one of said sequence of input vectors; N is a number of elements of said current input vector $y_n$; $\Sigma p, n$ is the current predictor error variance value associated with said current input vector $y_n$; and $x_{f,n-1}$ is said previous filtered estimate value.

Preferably, said parameter estimator has an OnsetFlag output coupled to an OnsetFlag input of said digital filter, wherein if a signal at said OnsetFlag input is above a threshold value dependent upon harmonic energy in said current input vector, said previous filtered estimate value is set to a filtered estimate value $x_{f,n-1}$.

Suitably, if said signal at said OnsetFlag input is below the threshold value dependent upon harmonic energy in said current input vector, said previous filtered estimate value is set to a previous input vector $y_{n-1}$.

Preferably, the parameter estimator has an unvoiced speech module that determines the current input vector's harmonic energy content by assessing the current predictor gain value and depending upon the current predictor gain value the parameter estimator selectively sets the current predictor gain value and the current observation noise variance value.

Suitably, said digital filter further includes:
a slowly evolving predicted estimate output providing a current predicted estimate value of said sequence of vectors. The digital filter may also have a process noise variance input.

Suitably, there may be a smoother module having inputs coupled respectively to at least two outputs of said digital filter.

Preferably, said smoother module has five inputs coupled to respective outputs of said filter. Preferably, said smoother module has a smoothed estimate output providing a smoothed estimate value of a previous slowly evolving component.

Suitably, said smoothed estimate output is coupled to a smoothed estimate input of said parameter estimator.

According to another aspect of the invention there is provided a method for processing a sequence of input vectors each comprising a plurality of elements, said vectors being applied to a vector estimation system having a parameter estimator coupled to a digital filter, said method comprising the steps of:

receiving said sequence of input vectors at inputs of said filter and said parameter estimator;

determining a current predictor gain value from a current input vector that is one of said sequence of said input vectors, said determining being effected by said parameter estimator; and applying said current predictor gain value to said digital filter to thereby modify a current filtered estimate value provided at an output of said digital filter, said current predictor gain value being dependent upon a previous filtered estimate value from said filter and said current input vector.

Preferably, said step of determining may be further characterised by providing a current observation noise variance value and a current predictor error variance value from said current input vector.

Suitably, said step of applying may be further characterised by said filter receiving current observation noise variance value thereby modifying said current filtered estimate value, said current observation noise variance value being dependent upon said previous filtered estimate value, said current input vector, said current predictor gain value and said current predictor error variance value.

According to another aspect of the invention there is provided a method for processing a sequence of input vectors each comprising a plurality of elements, said vectors being applied to a vector estimation system having a parameter estimator coupled to a digital filter, said method comprising the steps of:

receiving said sequence of input vectors at inputs of said filter and said parameter estimator;

determining a current observation noise variance value from a current input vector that is one of said sequence of said input vectors, said determining being effected by said parameter estimator; and applying said current observation noise variance value to said digital filter to thereby modify a current filtered estimate value provided at an output of said digital filter, said current observation noise variance value being dependent upon said current input vector, a current predictor error variance value from said filter, and a previous filtered estimate value from said filter.

Preferably, the filter is a Kalman filter.

According to another aspect of the invention there is provided an encoder for processing a speech signal, said encoder comprising:

A signal normalization module for processing the speech signal to provide a sequence of input vectors each comprising a plurality of elements;

a digital filter with a filter vector input coupled to an output of the signal normalization module for receiving said sequence of input vectors, the digital filter also having an observation noise variance input for controlling characteristics of said filter, said digital filter also having a current slowly evolving filter estimate output, a predictor error variance output and a previous slowly evolving filter estimate output, said current slowly evolving filter estimate output providing a current filtered estimate value of a slowly evolving component of said sequence of input vectors, said predictor error variance output providing a current predictor error variance value and said previous slowly evolving filter estimate output providing a previous filtered estimate value of said slowly evolving component of said sequence of input vectors;

a parameter estimator having an estimator vector input for receiving said sequence of input vectors and a previous slowly evolving filter estimate input coupled to said previous slowly evolving filter estimate output, said parameter estimator further includes a observation noise variance output coupled to said observation noise variance input; and a slowly evolving component encoder with an input coupled to said slowly evolving filter estimate output, wherein when said vector estimation system receives a current input vector that is one of said sequence of said input vectors, said parameter estimator provides a current observation noise variance value at said observation noise variance output thereby modifying said current filtered estimate value at said current slowly evolving filter estimate output, said current observation noise variance value being dependent upon said current input vector, said current predictor error variance value, and said previous filtered estimate value.

Preferably, the encoder may include an adder module with one input coupled said slowly evolving filter estimate output and another input coupled to the output of the signal normalization module, wherein in use said adder subtracts the said current filtered estimate value at the output of the vector estimation system from at least one of the elements of the sequence of input vectors.

Suitably, an output of the adder module is coupled to a rapidly evolving component encoder.

Suitably, said parameter estimator is characterised by said current observation noise variance value being dependent upon both a sequence of previous said input vectors and a sequence of filtered estimate values provided by successive preceding values of said previous filtered estimate value.

BRIEF DESCRIPTION OF THE DRAWINGS

In order that the invention may be readily understood and put into practical effect, reference will now be made to a preferred embodiment as illustrated with reference to the accompanying drawings in which.

DETAILED DESCRIPTION OF THE PREFERRED EMBODIMENT OF THE INVENTION

Figure 1:
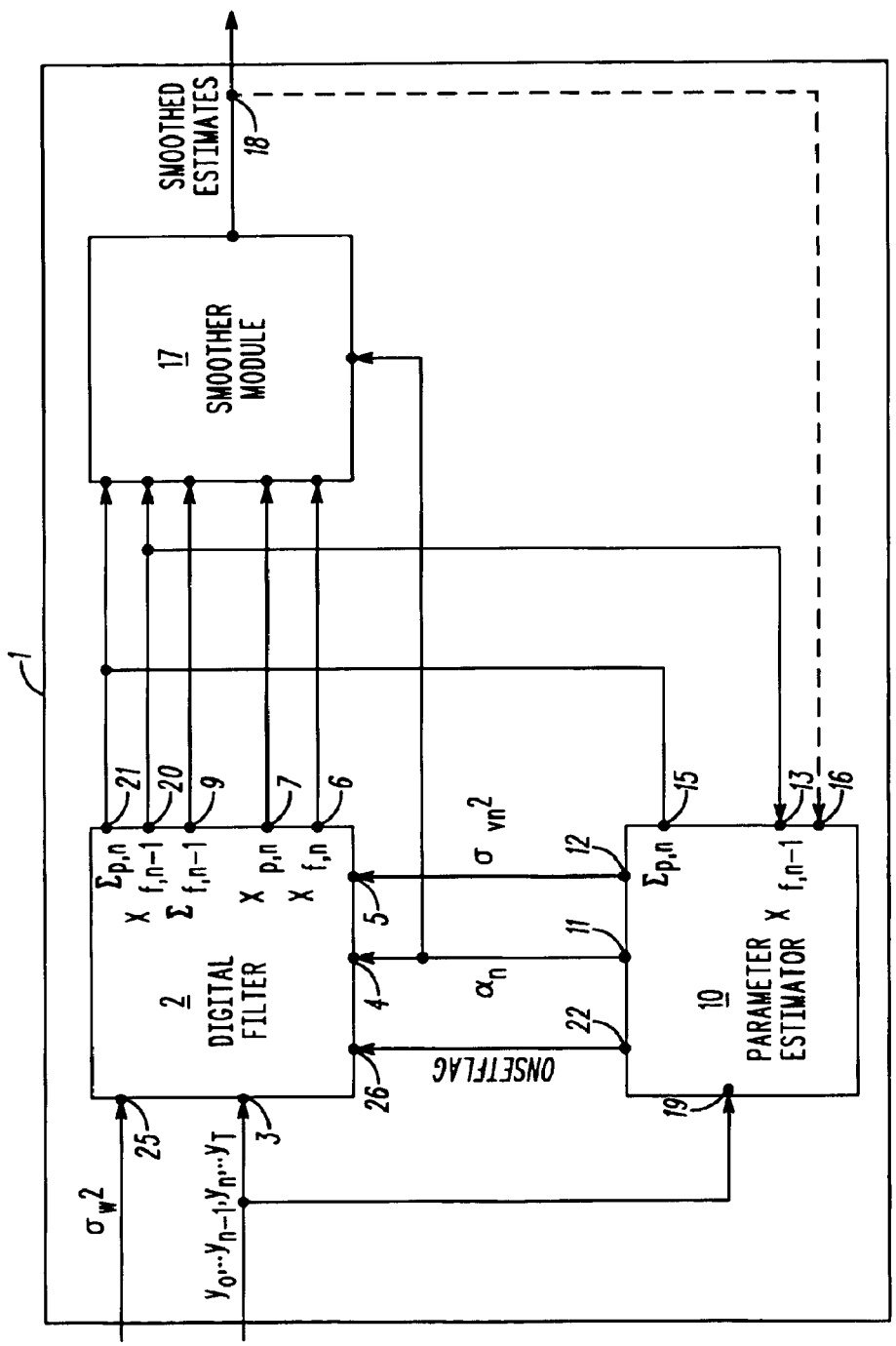
FIG. 1 illustrates a vector estimation system for processing a sequence of input vectors in accordance with a preferred embodiment of the invention.

In the drawings, like numerals on different Figs are used to indicate like elements throughout. Referring to FIG. 1, there is illustrated a vector estimation system 1 for processing a sequence of input vectors ($y_0$ to $y_T$). The vector estimation system 1 includes a digital filter 2, a parameter estimator 10 and a smoother module 17. The digital filter 2 has five inputs and five outputs. The five inputs of the digital filter 2 are a filter vector input 3, a predictor gain input 4, an observation noise variance input 5, an OnsetFlag input 26 and process noise variance input 25. The five outputs of the digital filter 2 are a current slowly evolving filter estimate output 6, a current slowly evolving predicted estimate output 7, a previous filter error variance output 9, a previous slowly evolving filter estimate output 20 and a current predictor error variance output 21.

The parameter estimator 10 has four inputs and three outputs. The parameter estimator 10 inputs are an estimator vector input 19 coupled to the vector input 3; a previous slowly evolving filter estimate input 13 coupled to the previous slowly evolving filter estimate output 20; a current predictor error variance input 15 coupled to the current predictor error variance output 21; and a smoothed estimate input 16. The three outputs of the parameter estimator 10 are a predictor gain output 11 coupled to the predictor gain input 4; an observation noise variance output 12 coupled to the observation noise variance input 5; and an OnsetFlag output 22 coupled to the OnsetFlag input 26.

The smoother module 17 has six inputs one being coupled to the slowly evolving filter estimate output 6; one coupled to the slowly evolving predicted estimate output 7; one coupled to the previous filter error variance output 9; one coupled to the previous slowly evolving filter estimate output 20; one coupled to the predictor error variance output 21; and one coupled to the predictor gain output 11. The smoother module 17 also has a smoothed estimate output 18 providing an output for the vector estimation system 1, the smoothed estimate output 18 is coupled to the smoothed estimate input 16 of the parameter estimator 10.

Figure 2:
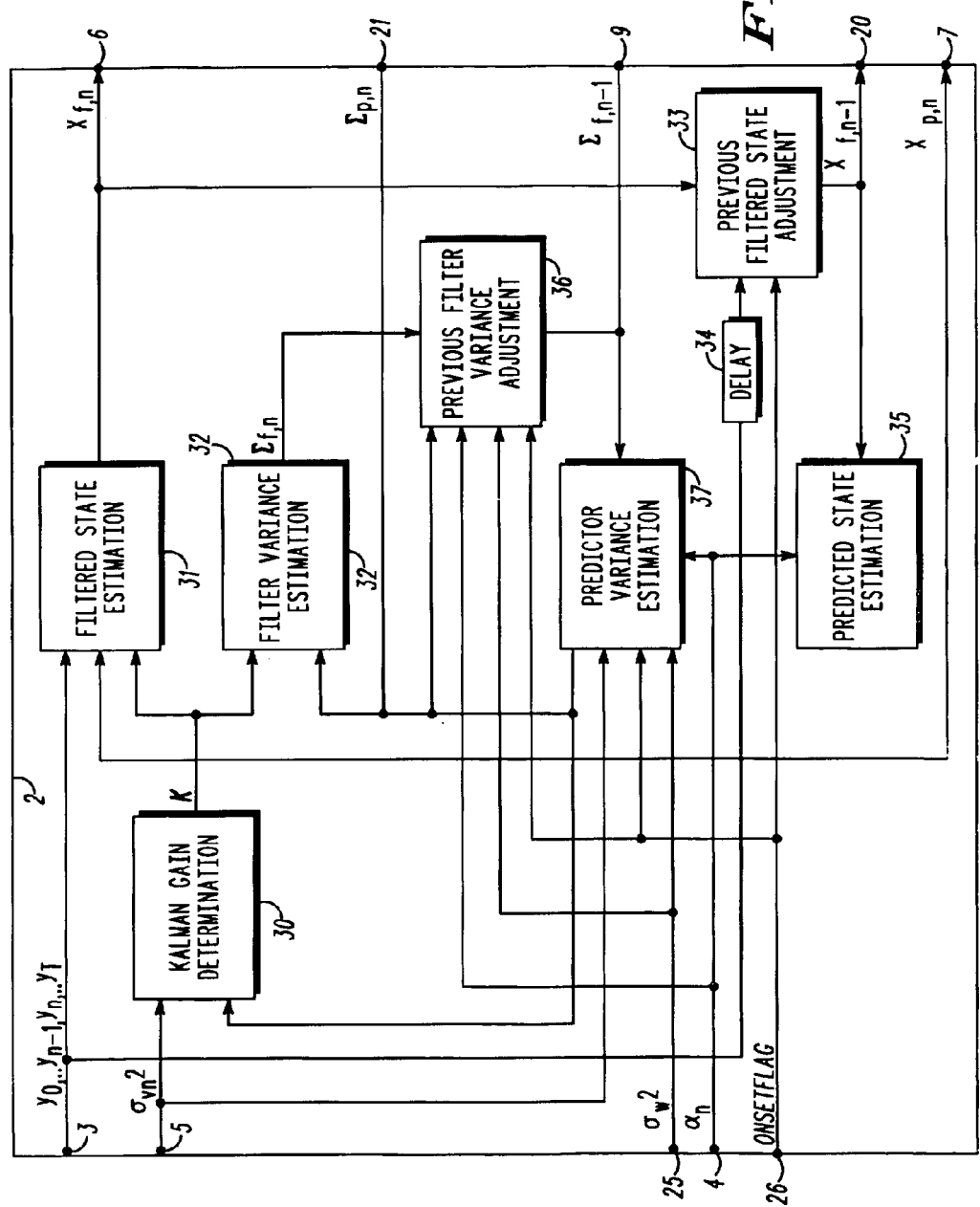
FIG. 2 illustrates a digital filter forming part of the vector estimation system of FIG. 1.

Referring to FIG. 2, the digital filter 2 is a comb filter in the form of a Kalman Filter Bank. The digital filter 2 comprises a Kalman gain determination module 30 with one input being the observation noise variance input 5. There is also a filtered state estimation module 31 with one input being the vector input 3 and another input being coupled to an output of the Kalman gain determination module 30. An output from the filtered state estimation module 31 provides the slowly evolving filter estimate output 6 that is coupled to an input of a previous filtered state adjustment module 33. Other inputs of the previous filtered state adjustment module 33 are provided by the OnsetFlag input 26 and the vector input 3 via a delay module 34.

An output from the previous filtered state adjustment module 33 provides the previous slowly evolving filter estimate output 20 that is coupled to an input of a predicted state estimation module 35. Another input to the predicted state estimation module 35 is provided by the predictor gain input 4. An output of the predicted state estimation module 35 provides the slowly evolving predicted estimate output 7 that is coupled to an input of the filtered state estimation module 31.

The output from the Kalman gain determination module 30 is also coupled to an input of a filter variance estimation module 32 that has an output coupled to an input to a previous filter variance adjustment module 36. An output from the previous filter variance adjustment module 36 provides the previous filter error variance output 9 that also provides an input to a predictor variance estimation module 37. Other inputs to the predictor variance estimation module 37 are provided by the predictor gain input 4, process noise variance input 25, OnsetFlag input 26 and observation noise variance input 5. An output from the predictor variance estimation module 37 provides the predictor error variance output 21 that is coupled to inputs of the Kalman gain determination module 30, the filter variance estimation module 32 and previous filter variance adjustment module 36. Other inputs to the previous filter variance adjustment module 36 are provided by the predictor gain input 4, the process noise variance input 25 and the OnsetFlag input 26.

As will be apparent to a person skilled in the art, the characteristics of the digital filter 2 are formalised in equations (1)–(6) below.

At an nth input vector $y_n$ (a current input vector) of the series of input vectors ($y_0$ to $y_T$) received by the system 1, the previous filtered state adjustment module 33 provides, at the previous slowly evolving filter estimate output 20, a previous filtered estimate value $x_{f,n-1}$.

The OnsetFlag input 26 is a binary signal input that indicates whether or not the beginning of a signal segment containing a significant amount of harmonic energy (determined by a threshold value) has been detected. If OnsetFlag input 26 is set to a value that indicates that the beginning of such a segment has been detected, then the previous filtered estimate value $x_{f,n-1}$ is set to an a previous input vector $y_{n-1}$.

Alternatively, if the OnsetFlag input 6 is set to a value that indicates that the beginning of a segment containing a significant amount of harmonic energy has been detected, then the previous filtered estimate value $x_{f,n-1}$ is set to a value of the previous input vector $y_{n-1}$ that was provided at vector input 3.

For the current input vector $y_n$, the digital filter 2 provides a current predicted estimate value $x_{p,n}$ at the predicted estimate output 7. The current predicted estimate value $x_{p,n}$ is computed according to:

$$x_{p,n} = \alpha_n \cdot x_{f,n-1} \qquad (1)$$

Where $\alpha_n$ is a current predictor gain value for the nth input vector $y_n$, provided at the predictor gain input 4.

Once the current predicted estimate value $x_{p,n}$ is computed, then also for the current input vector $y_n$ a current filtered estimate value $x_{f,n}$ is provided at the slowly evolving filter estimate output 6. This current filtered estimate value $x_{f,n}$ is computed according to:

$$x_{f,n} = x_{p,n} + K_n \cdot (y_n - x_{p,n}) \qquad (2)$$

Where $K_n$ is a current Kalman gain value for the digital filter 2 for the nth current input vector $y_n$.

The Kalman gain value K is computed according to:

$$K_n = \Sigma_{p,n} / (\Sigma_{p,n} + \sigma_{v,n}^2) \qquad (3)$$

Where, $\Sigma_{p,n}$ is a current predictor error variance value provided at the predictor error variance output 21 for the nth input vector $y_n$; and $\sigma_{v,n}^2$ is a current observation noise variance value provided at the observation noise variance input 5 also for the nth input vector $y_n$.

If the OnsetFlag is set to a value that indicates that the beginning of a signal segment containing a significant amount of harmonic energy has been detected, then the current predictor error variance value $\Sigma_{p,n}$ is typically set to the observation noise variance value $\sigma_{v,n}^2$. This results in Equation (3) producing a Kalman gain value $K_n$ equal to 0.5.

If OnsetFlag is set to a value that indicates that the beginning of a signal segment containing a significant amount of harmonic energy has not been detected, then the current predictor error variance value $\Sigma_{p,n}$ is computed according to:

$$\Sigma_{p,n} = \alpha_n \cdot \alpha_n \cdot \Sigma_{f,n-1} + \sigma_w^2 \qquad (4)$$

where $\sigma_w^2$ is a process noise variance value provided at the process noise variance input 25 and $\Sigma_{f,n-1}$ is a previous filtered error variance value for a previous input vector $y_{n-1}$.

If the OnsetFlag is set to a value that indicates that the beginning of a signal segment containing a significant amount of harmonic energy has not been detected then a current filtered error variance value $\Sigma_{f,n}$, provided at the output of the filter error variance estimation module 32, is computed according to:

$$\Sigma_{f,n} = (1 - K_n) \cdot \Sigma_{p,n} \qquad (5)$$

If the OnsetFlag is set to a value that indicates that the beginning of a signal segment containing a significant amount of harmonic energy has been detected, then the current filtered error variance value $\Sigma_{f,n}$ is computed according to:

$$\Sigma_{f,n} = (\Sigma_{p,n} - \sigma_w^2)/\alpha_n^2 \qquad (6)$$

Figure 3:
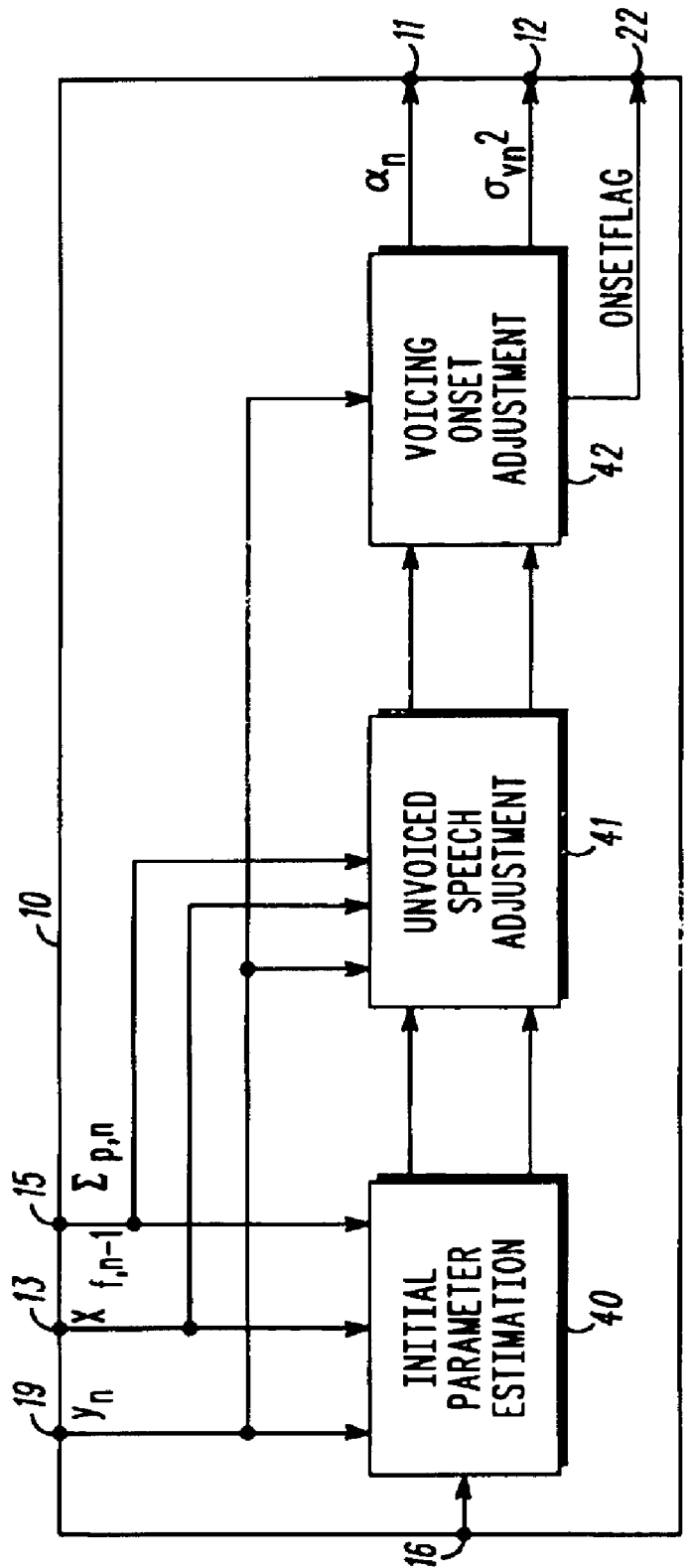
FIG. 3 illustrates a parameter estimator forming part of the vector estimation system of FIG. 1.

Referring to FIG. 3 there is illustrated the parameter estimator 10 that typically comprises an initial parameter estimation module 40, an unvoiced speech adjustment module 41 and a voicing onset adjustment module 42. The initial parameter estimation module 40 has four inputs provided by the predictor error variance input 15, the slowly evolving filter estimate input 13, the vector input 19 and the smoothed estimate input 16. Outputs of the parameter estimation module 40 are coupled to inputs of the unvoiced speech adjustment module 41 and a further inputs to module 41 are provided by the predictor error variance input 15, the slowly evolving filter estimate input 13 and the vector input 19. Outputs of the unvoiced speech adjustment module 41 are coupled to inputs the voicing onset adjustment module 42 and a further input to module 42 is provided by the vector input 3. The voicing onset adjustment module 42 has three outputs providing the predictor gain output 11, observation noise variance output 12 and OnsetFlag output 22.

The initial parameter estimation module 40 computes initial estimates of the current predictor gain value $\alpha_n$ and the current observation noise variance value $\sigma_{vn}^2$. These are determined as follows:

$$\alpha_n = (y_n^T \cdot x_{f,n-1})/(x_{f,n-1}^T \cdot x_{f,n-1}) \qquad (7)$$

$$\sigma_{vn}^2 = (y_n^T \cdot (y_n - \alpha_n \cdot x_{f,n-1})/N) - \Sigma p,n \qquad (8)$$

where N is the number of elements in the current input vector $y_n$ that is the nth one of the sequence of input vectors ($y_0$ to $y_T$) received at vector input 3; $y_n^T$ is the transpose of the current input vector $y_n$; and $x_{f,n-1}^T$ is the transpose of the previous filtered estimate value $x_{f,n-1}$ resulting from the previous input vector $y_{n-1}$ applied to the digital filter system 1. These estimate values are based on the assumption that both the current and at least the previous two input vectors represent signal segments containing a significant amount of harmonic energy.

It should be noted that for certain applications, the current predictor gain value $\alpha_n$ may by a set to a constant value of 1. Thus, current observation noise variance value $\sigma_{vn}^2$ is determined as follows:

$$\sigma_{vn}^2 = (y_n^T \cdot (y_n - x_{f,n-1})/N) - \Sigma p,n \qquad (8a)$$

The unvoiced speech adjustment module 41 determines whether the current input vector $y_n$ represents a segment of speech that contains no significant harmonic energy, and if so selectively sets the current predictor gain value $\alpha_n$ and the current observation noise variance value $\sigma_{vn}^2$ to appropriate values. Preferably, the unvoiced speech adjustment unit determines that the current input vector $y_n$ represents a segment of speech that contains no significant harmonic energy by detecting whether either of the following conditions is true:

(i) $\alpha_n$ is less than 0.0, or (ii) both $\alpha_n$ is greater than 1.0 and the initial estimation of the observation noise variance value is greater than mean squared value of elements in the current predicted estimate value.

If either conditions (i) or (ii) hold, then typically the unvoiced speech adjustment module 41 will set $\alpha_n$ to 1.0, and re-compute $\sigma_{vn}^2$ accordingly using Equation (8).

The voicing onset adjustment module 42 determines if the current input vector $y_n$ represents the second cycle of a segment of speech containing a significant amount of harmonic energy, and if so adjusts current predictor gain value $\alpha_n$ and the observation noise variance value $\sigma_{vn}^2$ to more appropriate values and sets the OnsetFlag to a value indicating that voicing onset has been detected.

Typically, the voicing onset adjustment module 42 determines that the current input vector $y_n$ is the second cycle of a segment of speech containing a significant amount of harmonic energy as follows. An input prediction gain, $\beta$, is computed according to:

$$\beta = (y_n^T \cdot y_{n-1})/(y_{n-1}^T \cdot y_{n-1}) \qquad (9)$$

An input prediction error variance value, $\sigma_e^2$, is computed according to:

$$\sigma_e^2 = y_n^T \cdot (y_n - \beta \cdot y_{n-1})/N \qquad (10)$$

The voicing onset adjustment unit determines whether both of the following conditions are true:

(iii) $\sigma_e^2$ is less than $k_1 \cdot \sigma_{vn}^2$, wherein $k_1$ is a constant, whose value is typically 0.9.

(iv) $\sigma_e^2$ divided by the mean squared value of the elements of the input vector is less than $k_2$, wherein $k_2$ is a constant, whose value is typically 0.5.

If both conditions (iii) and (iv) hold, then typically the voicing onset adjustment unit will set $\alpha_n$ to $\beta$ and set $\sigma_{vn}^2$ to $\sigma_e^2$.

Figure 4:
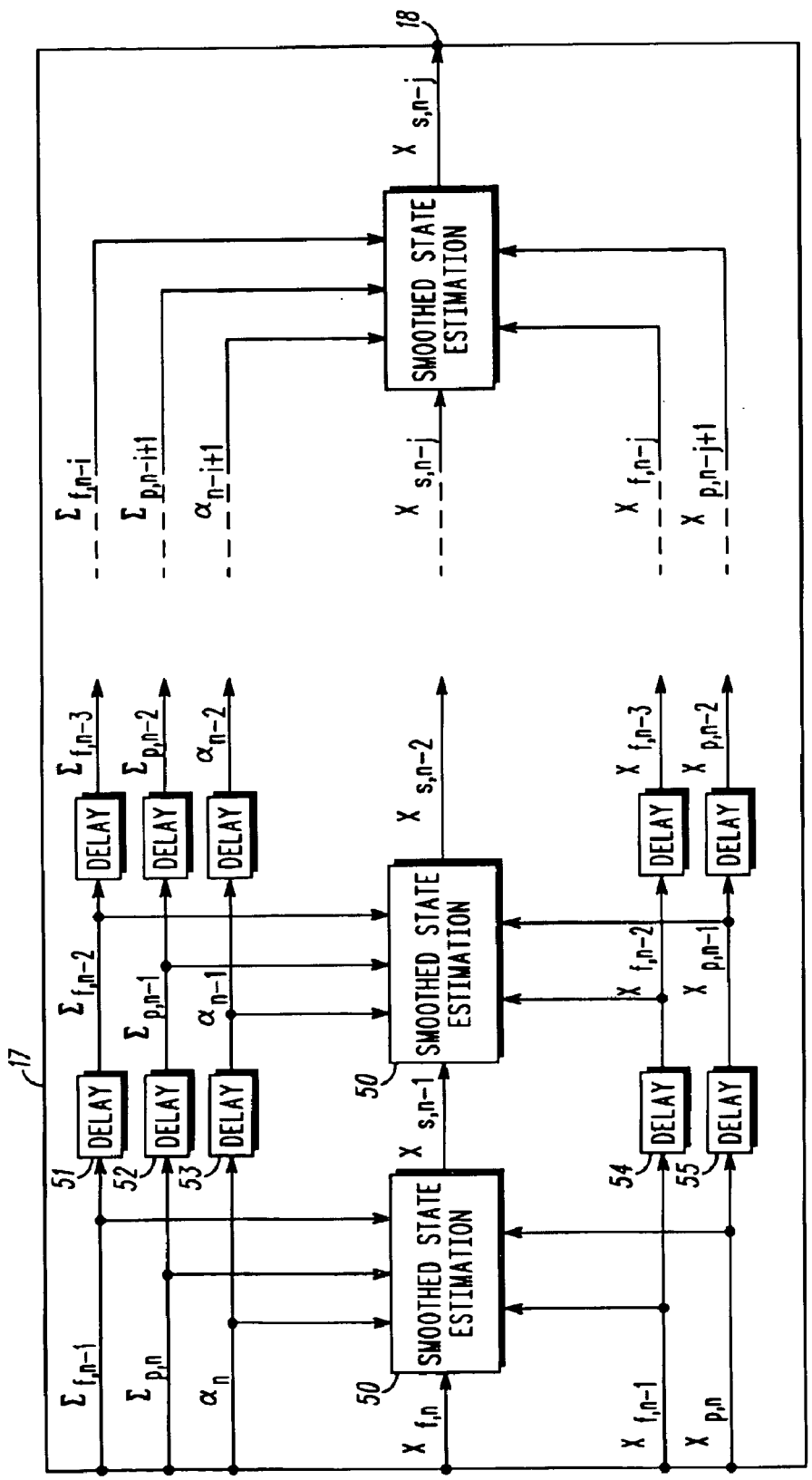
FIG. 4 illustrates a smoother module forming part of the vector estimation system of FIG. 1.

Referring to FIG. 4 there is illustrated the smoother module 17 that typically comprises series coupled smoothed state estimation modules 50 a first stage of which has an input receiving the current filtered estimate value $x_{f,n}$. The final stage of the smoothed state estimation module 50 provides a smoothed estimate value $x_{f,n-j}$ at output 18 of a previous slowly evolving component. The smoother module 17 also has five sets of series coupled delay modules 51,52,53,54 and 55 with respective outputs of an jth delay module 51,52,53,54 and 55 providing inputs to an j+1th smoothed state estimation module 50.

The smoothed state estimation modules 50 provide smoothed estimates $X_{s,(n-j)}$ for successive values of j beginning with j=1. These estimates are computed according to:

$$X_{s,(n-j)} = x_{f,(n-j)} + C \cdot (x_{s,(n-j+1)} - X_{p,(n-j+1)}) \qquad (11)$$

wherein $$C = (\Sigma_{f,-j} \cdot \alpha_{n-j}/\Sigma_{p,(n-j+1)}) \qquad (12)$$

and $$X_{s,n} = X_{f,n} \quad (13)$$

From the above it will be apparent that the purpose of the smoother module 17 is to provide an estimate $X_{s,(n-j)}$ of the slowly evolving component of an input vector $y_{n-j}$ based upon input vectors up to and including $y_n$. The smoother module 17 thus uses current data to estimate a past slowly evolving component value, in contrast to the digital filter 2, which uses current data to estimate a current slowly evolving component value.

In use, the vector estimation system 1 receives the sequence of input vectors $y_0$ to $y_T$ that are each comprising N elements. Each of the input vectors $y_0$ to $y_T$ contains a sampled period of a presumed quasiperiodic signal. This sampled signal is typically time warped to allow for variations of quasiperiodic periods, so that each input vector contains the same number of elements, as will be apparent to a person skilled in the art. Alternatively, consecutive input vectors $y_0$ to $y_T$ may have elements added to them or removed from them, again so that the resulting number of elements in each is the same. For an nth iteration, a input vector $y_n$ will be applied to vector input 3 and estimator vector input 19. The digital filter 2 processes this input vector $y_n$ resulting in the slowly evolving filter estimate output 6 providing, to input 13, the previous filtered estimate value $x_{f,n-1}$ of a slowly evolving component of sequence of vectors $y_0$ to $y_T$.

The parameter estimator 10 processes the previous filtered estimate value $x_{f,n-1}$ and current input vector $y_n$ to provide a current current predictor gain value $\alpha_n$ at predictor output 11. The current predictor gain value $\alpha n$ is thereby applied to input 4 of the digital filter 2 for controlling the gain thereof during filtering of input vector $y_n$. The parameter estimator 10 determines the current predictor gain value $\alpha_n$ by the calculation stated in equation (7).

As will be apparent to a person skilled in the art, at initialisation (i.e. the first sample time when n is 0 therefore input vector $y_0$ is applied to digital filter system 1), there will be no previous filtered estimate value $x_{f,n-1}$. Accordingly, although there are many ways to allocate a value for this previous filtered estimate value $x_{f,n-1}$, the present invention preferably assigns the previous filtered estimate value $x_{f,n-1}$ with the same element values as input vector $y_0$.

Figure 5:
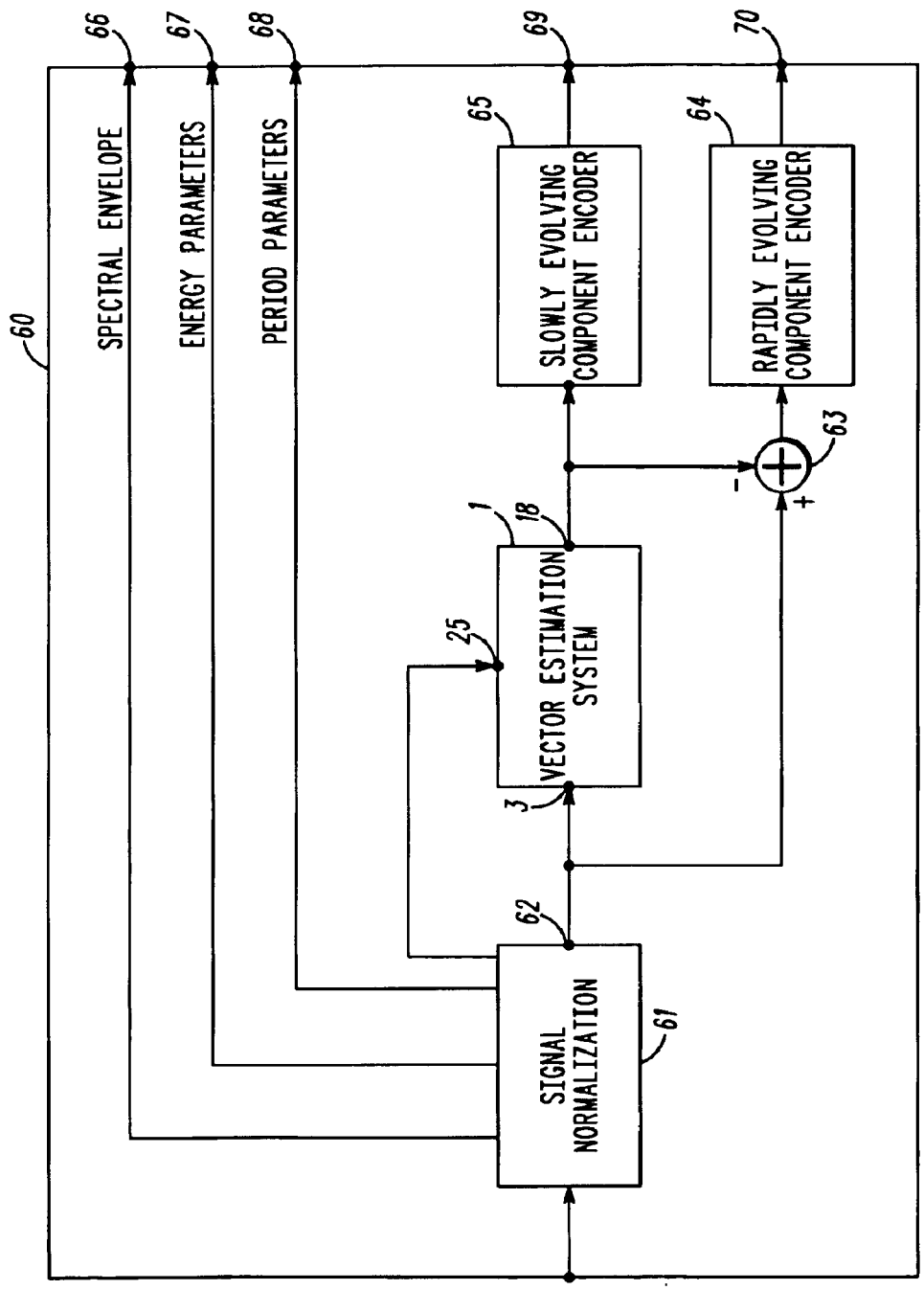
FIG. 5 illustrates a speech encoder that includes the vector estimation system of FIG. 1.

Referring to FIG. 5, the vector estimation system 1 can advantageously included in a speech encoder 60. The speech encoder 60 includes a signal normalization module 61 with an input for receiving a speech signal. A signal vector output 62 of the signal normalization module 61 is coupled to filter vector input 3 and another output is coupled to the process noise variance input 25 of the vector estimation system 1. The signal vector output 62 is also coupled to an input of an adder module 63 and another input of the adder module 63 is coupled to the smoothed estimate output 18 of the vector estimation system 1. An output from the adder module 63 is coupled to an input of a rapidly evolving component encoder 64 and there is also a slowly evolving component encoder 65 having an input coupled to the smoothed estimate output 18. The speech encoder 60 has three outputs from the signal normalization module 61, for coupling to a speech decoder, these outputs being a spectral envelope output 66, an energy parameters output 67 and a period parameters output 68. The speech encoder 60 also has a slowly evolving component output 69 from the evolving component encoder 65 and a rapidly evolving component output 70 from the rapidly evolving component encoder 64.

In operation, the speech encoder 60 firstly normalizes a speech signal with respect to its spectral envelope, energy and period. The normalisation process involves estimating parameters that describe the spectral envelope, energy and period of the input signal and these parameters are typically transmitted to a speech decoder at outputs 66,67,68. Process noise variance provide at the process noise variance input 25 is typically used to control the vector estimation system 1. The normalisation process produces the sequence of input vectors ($y_0$ to $y_T$) for the vector estimation system 1. The sequence of input vectors ($y_0$ to $y_T$) are a sequence of fixed length vectors representing sampled consecutive cycles of the normalised waveform. These vectors ($y_0$ to $y_T$) are applied to the filter vector input 3 of the vector estimation system 1, which generates a slowly evolving component at the smoothed estimate output 18. By subtracting this slowly evolving component from the input vectors ($y_0$ to $y_T$), a rapidly evolving, or noise-like component is produced and provided to the rapidly evolving component encoder 64. The slowly evolving and rapidly evolving components are encoded respectively by the slowly and rapidly evolving component encoders 64, 65. The encoders 64,65 use appropriate methods known in the art to produce parameters at respective outputs 70,69 which are transmitted to a speech decoder.

Advantageously, as can be seen with reference to equation (7), the present invention provides for the vector estimation system 1 to receive the current input vector $y_n$ that is one of a the sequence of input vectors $y_0$ to $y_T$. The parameter estimator 10 provides the current predictor gain value $\alpha_n$ at the predictor gain output 11 thereby modifying the current filtered estimate value $x_{f,n}$ at the slowly evolving filter estimate output 6. In this regard, the current predictor gain value $\alpha_n$ is dependent upon the previous filtered estimate value $x_{f,n-1}$ and the current input vector $y_n$. As will be apparent to a person skilled in the art, the parameter estimator 10 determines the current predictor gain value $\alpha_n$ from both a sequence of previous input vectors $y_{n-1}$ to $y_0$ and a sequence of corresponding filtered estimate values provided by successive preceding values of the previous filtered estimate value $x_{f,0}$ to $x_{f,n-1}$.

With reference to equation (8), the present invention also advantageously provides for the vector estimation system 1 to receive the current input vector $y_n$. The parameter estimator 10 provides the current observation noise variance value $\sigma_{v,n}^2$ at the observation noise variance output 12 thereby modifying current filtered estimate value $x_{f,n}$ at the slowly evolving filter estimate output 6. The current observation noise variance value $\sigma_{v,n}^2$ is dependent upon the current input vector $y_n$, the current predictor gain value $\alpha_n$ (that can be set to a constant value of 1 for certain applications), the current predictor error variance value $\Sigma p,n$, and said previous filtered estimate value $x_{f,n-1}$.

The detailed description provides a preferred exemplary embodiment only, and is not intended to limit the scope, applicability, or configuration of the invention. Rather, the detailed description of the preferred exemplary embodiment provides those skilled in the art with an enabling description for implementing a preferred exemplary embodiment of the invention. It should be understood that various changes may be made in the function and arrangement of elements without departing from the spirit and scope of the invention as set forth in the appended claims.

We claim:

1. A system for processing a sequence of input vectors, said input vectors each comprising a plurality of elements, and said system comprising:

a digital filter with a filter vector input for receiving said sequence of input vectors obtained from a digitized speech signal and a predictor gain input for controlling characteristics of said filter, said digital filter also having both a current slowly evolving filter estimate output and a previous slowly evolving filter estimate output, said current slowly evolving filter estimate output providing a current filtered estimate value of a slowly evolving component of said sequence of input vectors and said previous slowly evolving filter estimate output providing a previous filtered estimate value of said slowly evolving component of said sequence of input vectors;

a parameter estimator having an estimator vector input for receiving said sequence of input vectors and a previous slowly evolving filter estimate input coupled to said previous slowly evolving filter estimate output, said parameter estimator further includes a predictor gain output coupled to said predictor gain input;

a smoother module having inputs coupled respectively to at least two outputs of said digital filter, said smoother module having a smoothed estimate output providing a smoothed estimate value of a said previous slowly evolving component; and a slowly evolving component encoder with an input coupled to said smoothed estimate output, wherein when said system receives a current input vector that is one of said sequence of said input vectors, said parameter estimator provides a current predictor gain value at said predictor gain output thereby modifying both paid current filtered estimate value at said current slowly evolving filter estimate output and said smoothed estimate value, said current predictor gain value being dependent upon both said previous filtered estimate value received at said slowly evolving filter estimate input and said current input vector received at said estimator vector input, and wherein the slowly evolving component encoder processes said smoothed estimate value to provide a digitized encoded slowly evolving component of the speech signal.

2. A system as claimed in claim 1, wherein said parameter estimator is characterised by said current predictor gain value being dependent upon both a sequence of previous said input vectors and a sequence of filtered estimate values provided by successive preceding values of said previous filtered estimate value.

3. A system as claimed in claim 2, wherein said current predictor gain value is determined by said parameter estimator calculating the following:

$$(y_n^T \cdot x_{f,n-1})/(x_{f,n-1}^T \cdot x_{f,n-1})$$

wherein, $Y_n^T$ is the transpose of said current input vector $y_n$ that is an nth one of said sequence of input vectors; and $x_{f,n-1}^T$ is the transpose of the previous filtered estimate value $x_{f,n-1}$ resulting from a previous input vector $y_{n-1}$.

4. A system as claimed in claim 1, wherein said filter has a predictor error variance output and an observation noise variance input, said predictor error variance output providing a current predictor error variance value.

5. A system as claimed in claim 4, wherein said parameter estimator has an observation noise variance output coupled to said observation noise variance input, and a predictor error variance input coupled to said predictor error variance output, said predictor error variance output providing a current predictor error variance value, wherein when said vector estimation system receives said current input vector, said parameter estimator provides a current observation noise variance value at said observation noise variance output thereby modifying said current filtered estimate value at said current slowly evolving filter estimate output, said current observation noise variance value being dependent upon said previous filtered estimate value received at said previous slowly evolving filter estimate input, said current input vector received at said estimator vector input, said current predictor gain value and said current predictor error variance value.

6. A system as claimed in claim 5, wherein, said current observation noise variance value is determined by calculating the following:

$$(y_n^T \cdot (y_n - \alpha_n \cdot x_{f,n-1})/N) - \Sigma_{p,n}$$

wherein N is a number of elements of said current input vector $y_n$; $\Sigma_{p,n}$ is the current predictor error variance value associated with said current input vector $y_n$; $\alpha_n$ is said current predictor gain value; and $x_{f,n-1}$ is said previous filtered estimate value.

7. A system as claimed in claim 5, wherein the parameter estimator has an unvoiced speech module that determines the current input vector's harmonic energy content by assessing the current predictor gain value and depending upon the current predictor gain value the parameter estimator selectively sets the current predictor gain value and the current observation noise variance value.

8. A system as claimed in claim 1, wherein said parameter estimator has an OnsetFlag output coupled to an OnsetFlag input of said digital filter, wherein if a signal at said OnsetFlag input is below a threshold value dependent upon harmonic energy in said current input vector, said previous filtered estimate value is set to a filtered estimate value.

9. A system as claimed in claim 8, wherein if said signal at said OnsetFlag input is below the threshold value dependent upon harmonic energy in said current input vector, said previous filtered estimate value is set to a previous input vector $y_{n-1}$.

10. A system as claimed in claim 1, wherein said smoother module has five inputs coupled to respective outputs of said filter.

11. A system for processing a sequence of input vectors, said input vectors each comprising a plurality of elements, and said system comprising:

a digital filter with a filter vector input for receiving said sequence of input vectors obtained from a digitized speech signal and an observation noise variance input for controlling characteristics of said filter, said digital filter also having a current slowly evolving filter estimate output, a predictor error variance output and a previous slowly evolving filter estimate output, said current slowly evolving filter estimate output providing a current filtered estimate value of a slowly evolving component of said sequence of input vectors, said predictor error variance output providing a current predictor error variance value and said previous slowly evolving filter estimate output providing a previous filtered estimate value of said slowly evolving component of said sequence of input vectors;

a parameter estimator having an estimator vector input for receiving said sequence of input vectors and a previous slowly evolving filter estimate input coupled to said previous slowly evolving filter estimate output, said parameter estimator further includes a observation noise variance output coupled to said observation noise variance input;

a smoother module having inputs coupled respectively to at least two outputs of said digital filter, said smoother module having a smoothed estimate output providing a smoothed estimate value of a said previous slowly evolving component; and a slowly evolving component encoder with an input coupled to said smoothed estimate output, wherein when said system receives a current input vector that is one of said sequence of said input vectors, said parameter estimator provides a current observation noise variance value at said observation noise variance output thereby modifying both said current filtered estimate value at said current slowly evolving filter estimate output and said smoothed estimate value, said current observation noise variance value being dependent upon said current input vector, said current predictor error variance value, and said previous filtered estimate value, and wherein the slowly evolving component encoder processes said smoothed estimate value to provide a digitized encoded slowly evolving component of the speech signal.

12. A system as claimed in claim 11, wherein said current observation noise variance value is determined by calculating the following:

$$(y_n^T \cdot (y_n - x_{f,n-1})/N) - \Sigma_{p,n}$$

wherein $y_n^T$ is the transpose of said current input vector $y_n$ that is an nth one of said sequence of input vectors; N is a number of elements of said current input vector $y_n$; $\Sigma_{p,n}$ is the current predictor error variance value associated with said current input vector $y_n$; and $x_{f,n-1}$ is said previous filtered estimate value.

13. A system as claimed in claim 11, wherein said parameter estimator has an OnsetFlag output coupled to an OnsetFlag input of said digital filter, wherein if a signal at said OnsetFlag input is below a threshold value dependent upon harmonic energy in said current input vector, said previous filtered estimate value is set to a filtered estimate value.

14. A system as claimed in claim 13, wherein, if said signal at said OnsetFlag input is below the threshold value dependent upon harmonic energy in said current input vector, said previous filtered estimate value is set to a previous input vector.

15. A system as claimed in claim 11, wherein the parameter estimator has an unvoiced speech module that determines the current input vector's harmonic energy content by assessing the current predictor gain value and depending upon the current predictor gain value the parameter estimator selectively sets the current predictor gain value and the current observation noise variance value.

16. A system as claimed in claim 11, wherein said digital filter further includes:

a slowly evolving predicted estimate output providing a current predicted estimate value of said sequence of vectors.

17. A system as claimed in claim 11, wherein said smoother module has five inputs coupled to respective outputs of said filter.

18. An encoder for processing a speech signal each comprising a plurality of elements, and said encoder comprising:

a signal normalization module for processing the speech signal to provide a sequence of input vectors each comprising a plurality of elements;

a digital filter with a filter vector input coupled to an output of the signal normalization module for receiving said sequence of input vectors, the digital filter also having an observation noise variance input for controlling characteristics of said filter, said digital filter also having a current slowly evolving filter estimate output, a predictor error variance output and a previous slowly evolving filter estimate output, said current slowly evolving filter estimate output providing a current filtered estimate value of a slowly evolving component of said sequence of input vectors, said predictor error variance output providing a current predictor error variance value and said previous slowly evolving filter estimate output providing a previous filtered estimate value of said slowly evolving component of said sequence of input vectors;

a parameter estimator having an estimator vector input for receiving said sequence of input vectors and a previous slowly evolving filter estimate input coupled to said previous slowly evolving filter estimate output, said parameter estimator further includes a observation noise variance output coupled to said observation noise variance input; and a slowly evolving component encoder with an input coupled to said slowly evolving filter estimate output, wherein when said vector estimation system receives a current input vector that is one of said sequence of said input vectors, said parameter estimator provides a current observation noise variance value at said observation noise variance output thereby modifying said current filtered estimate value at said current slowly evolving filter estimate output, said current observation noise variance value being dependent upon said current input vector, said current predictor error variance value, and said previous filtered estimate value, and wherein the slowly evolving component encoder processes said current filtered estimate value to provide a digitized encoded slowly evolving component of the speech signal.

19. An encoder for processing a speech signal as claimed in claim 18, the encoder further including an adder module with one input coupled said slowly evolving filter estimate output and another input coupled to the output of the signal normalization module, wherein in use said adder subtracts the said current filtered estimate value at the output of the vector estimation system from at least one of the elements of the sequence of input vectors.

20. An encoder for processing a speech signal as claimed in claim 19, wherein an output of the adder module is coupled to a rapidly evolving component encoder.

21. An encoder for processing a speech signal as claimed in claim 18, wherein said parameter estimator is characterised by said current observation noise variance value being dependent upon both a sequence of previous said input vectors and a sequence of filtered estimate values provided by successive preceding values of said previous filtered estimate value.

* * * * *